United States Patent [19]
Kim et al.

[11] Patent Number: 6,163,517
[45] Date of Patent: Dec. 19, 2000

[54] SIGNAL DETECTION METHOD OF DATA RECORDING/REPRODUCING APPARATUS AND DEVICE THEREFOR

[75] Inventors: Seong-jin Kim; Yung-soo Kim, both of Sungnam; Ji-yong Jun, Seoul, all of Rep. of Korea

[73] Assignee: Samsung Electronics Co., Ltd., Suwon, Rep. of Korea

[21] Appl. No.: 09/109,408

[22] Filed: Jul. 2, 1998

[30] Foreign Application Priority Data

Jul. 4, 1997 [KR] Rep. of Korea ............ 97-31139

[51] Int. Cl.[7] ............................................. G11B 7/00
[52] U.S. Cl. ............... 369/59; 369/124.01; 369/124.05; 369/124.09; 360/51
[58] Field of Search .......... 369/59, 124, 124.01, 369/124.04, 124.05, 124.06, 124.07, 124.09, 124.13, 124.14, 124.15, 47, 48; 360/51, 46, 40; 371/43; 375/341; 348/607, 608

[56] References Cited

U.S. PATENT DOCUMENTS

| | | | |
|---|---|---|---|
| 5,581,568 | 12/1996 | Togami | 371/43 |
| 5,625,632 | 4/1997 | Ishida et al. | 371/43 |
| 5,648,822 | 7/1997 | Hulyalkar | 348/607 |
| 5,768,320 | 6/1998 | Kavacs et al. | 360/46 |
| 5,886,842 | 3/1999 | Ziperovich | 360/51 |
| 5,949,831 | 9/1999 | Coker et al. | 360/51 |

*Primary Examiner*—Thang V. Tran
*Attorney, Agent, or Firm*—Burns, Doane, Swecker & Mathis, L.L.P.

[57] ABSTRACT

A signal detection device and method of a data recording/reproducing apparatus. The signal detection device of a data recording/reproducing apparatus for recording/reproducing a digital signal $U_k$ having an arbitrary integer time k as an index, includes: an analog-to-digital converter (ADC) for converting an analog signal from which external band noise is removed after being reproduced from the data recording/reproducing apparatus, into a digital signal; a filter for modifying the digital signal converted by the analog-to-digital converter (ADC) into a signal having a predetermined spectral shape; and a Viterbi detector for detecting the spectrum signal modified by the filter as the data recorded in the data recording/reproducing apparatus. Therefore, after equalizing a signal into a spectrum expressed by $2+D+D^2+D^3$, which is similar to the spectrum of an optical recording/reproducing apparatus, the maximum likelihood (ML) is detected by the Viterbi detector. Accordingly, noise scarcely increases and loss by intersymbol interference is overcome, so that the signal can be detected with reliability.

16 Claims, 7 Drawing Sheets

SIGNAL DETECTION METHOD OF DATA RECORDING/REPRODUCING APPARATUS AND DEVICE THEREFOR

This application claims priority under 35 U.S.C. §§119 and/or 365 to 97-31139 filed in Republic of Korea on Jul. 4, 1997; the entire content of which is hereby incorporated by reference.

BACKGROUND OF THE INVENTION

1. Field of the Invention

The present invention relates to a signal detection method and a device of a data recording/reproducing apparatus and, more particularly, to a signal detection method and device of a data recording/reproducing apparatus, by which data reproduced from a data recording/reproducing apparatus is processed such that the data recorded in the data recording/reproducing apparatus can be detected exactly.

2. Description of the Related Art

In this information age, much research has been conducted in a high-speed and high-capacity data storage devices for easily storing and using massive amounts of data.

In general, signals passed through an optical recording/reproducing apparatus interfere with each other, as data is recorded with a high density, making signal detection difficult. Such interference is linearly modeled in an optical recording/reproducing apparatus, in this respect which is similar to a magnetic recording/reproducing apparatus.

However, because high frequency light is scattered greatly by reflection when detecting signals, not at all the high frequency light cannot reach a detector. Thus, the spectral density of signals with respect to frequency in the optical recording/reproducing apparatus is more rapidly decreased than in the magnetic recording/reproducing apparatus. Thus, the optical recording/reproducing apparatus may be a linear system for passing only low frequency signals. Also, the average DC value as a reference for (+)/(−) signal detection is riot stable in this state, so the signal becomes unstable. In order to detect signals by overcoming such phenomena, an eight-to-fourteen modulation-plus (EFM-plus) code is used for recording data, and a suitable equalizer and detector are used for reading the data. The equalizer corrects the signals distorted by mutual interference to make the signal detection easy. The detector properly classifies the signals passed through the equalizer into +1 or −1. In particular, an optical recording/reproducing channel has a null frequency shorter than a rate ½T, so that it is unfavorable to detect data by completely removing intersymbol interference (ISI). That is, it is favorable to leave some degree of constructive ISI which is helpful for detection. However, a detection method using a minimum mean square error (MMSE) linear equalizer and a threshold detector completely removes ISI, thereby amplifying noise, and as a result, the performance of an apparatus is lower. Also, a decision feedback equalizer (DFE) is realized within the limits of the number of taps, so that removal of ISI is also limited, thereby leaving ISI. However, the remaining ISI is destructive for detection and badly affects a detector, thereby lowering performance. Also, a method using a partial response maximum likelihood (PRML) is not suitable for a target of a conventional $(1+D)^n$ power/spectrum in which the null cycle is set to the channel having a cycle of ½T. Thus, the PRML method should establish another PR target.

SUMMARY OF THE INVENTION

To solve the above problems, it is an objective of the present invention to provide a signal detection method and device of a data recording/reproducing apparatus, by which a signal reproduced from the data recording/reproducing apparatus is processed such that data recorded in the data recording/reproducing apparatus is detected accurately, and a device therefor.

According to an aspect of the above objective, there is provided a signal detection method of a data recording/reproducing apparatus for recording/reproducing a digital signal $U_k$ having an arbitrary integer time k as an index, the method comprising the steps of: (a) converting an analog signal from which external band noise is removed after being reproduced from the data recording/reproducing apparatus, into a digital signal; (b) modifying the digital signal into a signal having a predetermined spectral shape; and (c) detecting the modified spectrum signal which is expressed by a polynomial equation of $$2+D+D^2+D^3$$

as the data recorded in the data recording/reproducing apparatus.

According to another aspect of the objective, there is provided a signal detection device of a data recording/reproducing apparatus for recording/reproducing a digital signal $U_k$ having an arbitrary integer time k as an index, comprising: an analog-to-digital converter (ADC) for converting an analog signal from which external band noise is removed after being reproduced from the data recording/reproducing apparatus, into a digital signal; a filter for modifying the digital signal converted by the analog-to-digital converter (ADC) into a signal having a predetermined spectral shape; and a Viterbi detector for detecting the spectrum signal modified by the filter as the data recorded in the data recording/reproducing apparatus.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Figure 1:
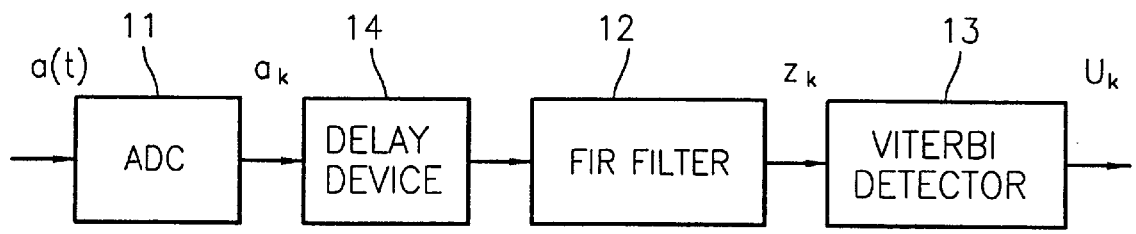
FIG. 1 is a block diagram of a signal detecting device for a data recording/reproducing apparatus according to the present invention.

Referring to FIG. 1, a signal detecting device of a data recording/reproducing apparatus for recording/reproducing a digital signal $U_k$ having an integer time k as an index according to the present invention comprises an analog-to-digital converter 11 for converting a reproduced analog signal from which external band noise has been removed after being reproduced from the data recording/reproducing apparatus, a finite impulse response (FIR) filter 12 for modifying the digital signal converted by the ADC 11 into a predetermined spectrum signal, e.g., a spectrum signal expressed by a polynomial expression of $2+D+D^2+D^3$, and a Viterbi detector 13 for detecting the spectrum signal modified by the FIR filter 12 as data recorded in the data recording/reproducing apparatus. Also, preferably, the signal detecting device further comprises a delay device 14 between the ADC 11 and the FIR filter 12, for delaying the output of the ADC 11 for a predetermined time to match a clock for processing the digital signal.

Figure 3:
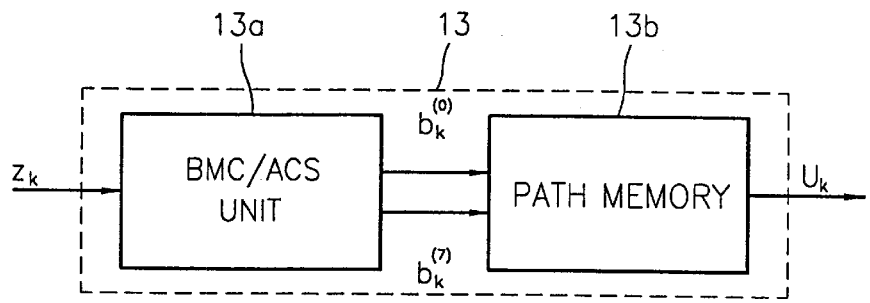
FIG. 3 is a diagram showing the structure of an internal system of a Viterbi detector of the signal detecting device shown in FIG. 1.

As shown in FIG. 3, the Viterbi detector 13 includes a branch metric computation/add compare select (BMC/ACS) unit 13a for computing and updating state metrics, and a path memory 13b for deciding the final output of the Viterbi detector 13 based on the data computed and updated by the BMC/ACS unit 13a.

Figure 4:
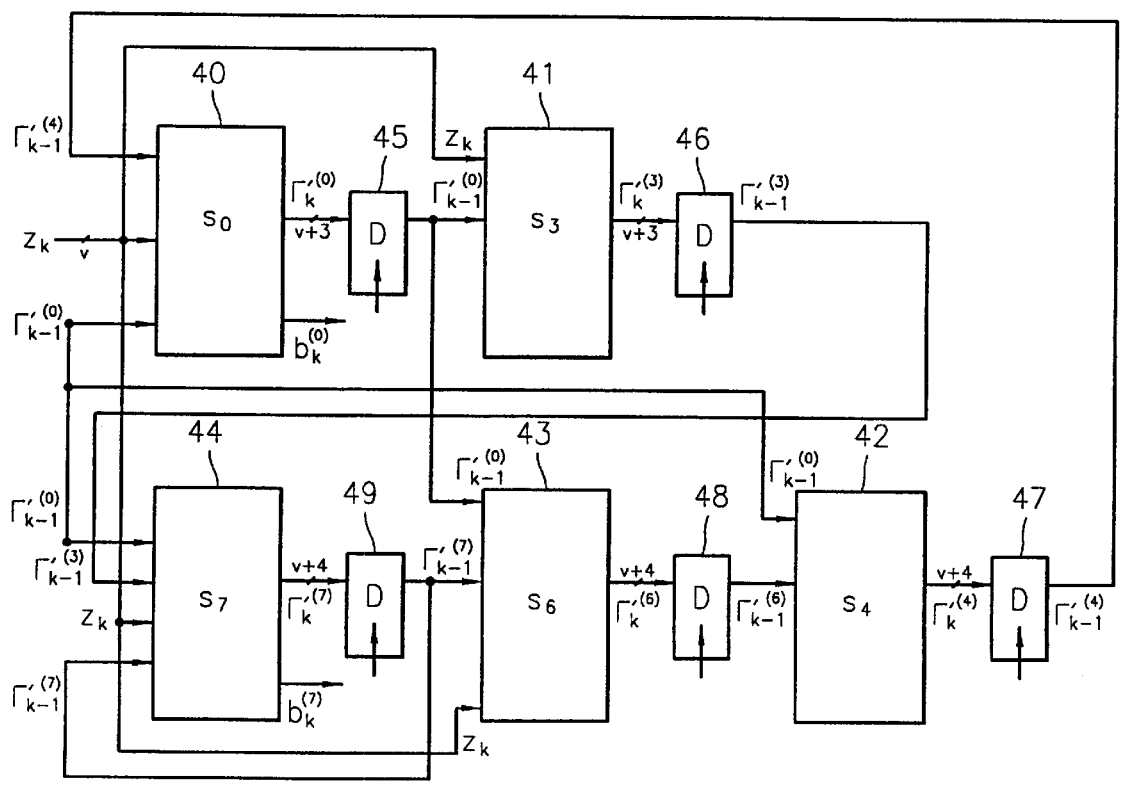
FIG. 4 is a diagram showing the structure of an internal system of a BMC/ACS of the Viterbi detector shown in FIG. 3.

As shown in FIG. 4, the BMC/ACS unit 13a is formed as a combination circuit of first, second, third, fourth and fifth states 40, 41, 42, 43 and 44 for simultaneously generating and outputting decisive bits, and five delay devices 45, 46, 46, 48 and 49 for respectively delaying the output signals of the five states 40 through 44 for a predetermined time and outputting the delayed signals.

Figure 5:
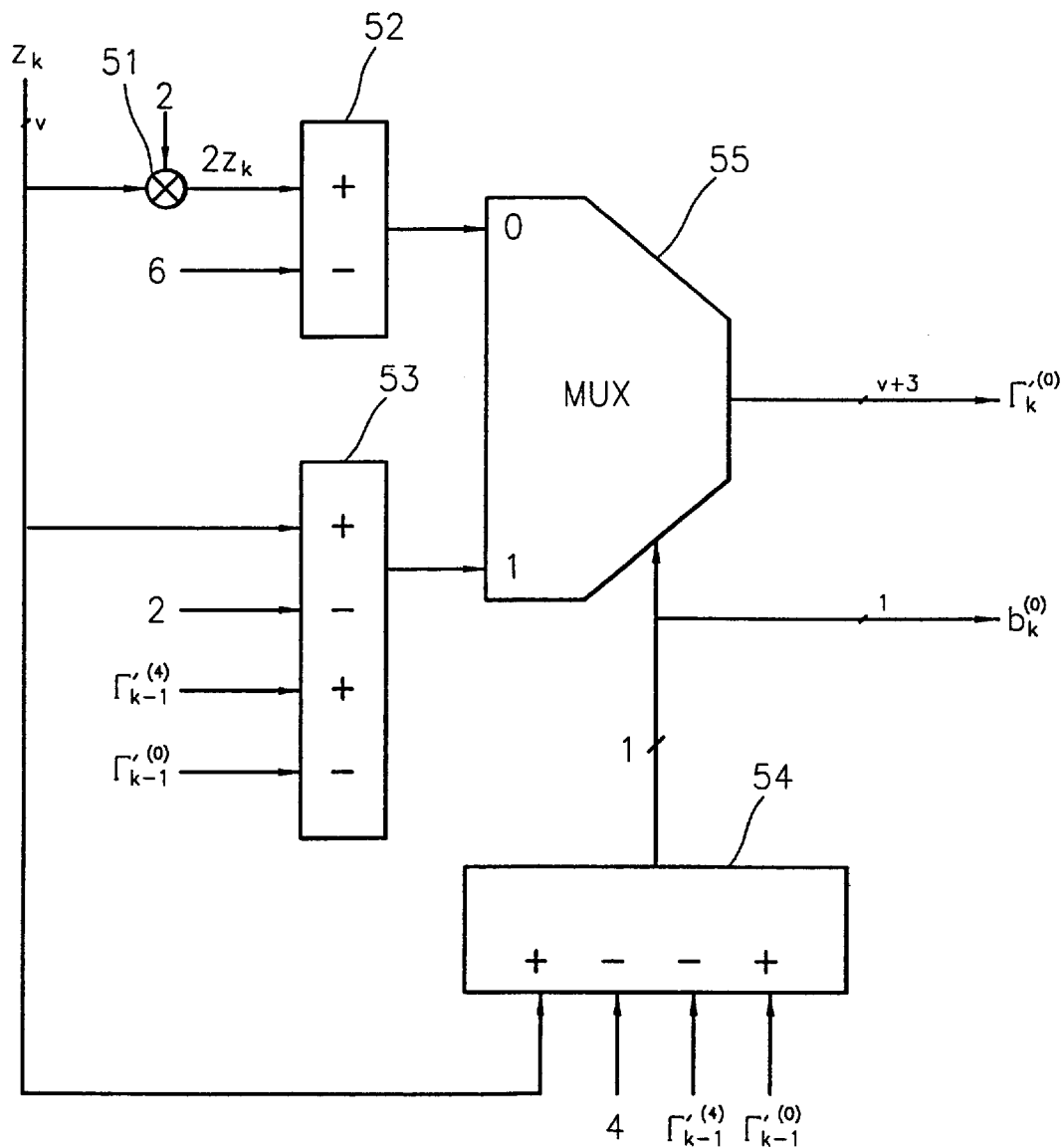
FIG. 5 shows an operational algorithm in the first state $s_0$ of the BMC/ACS shown in FIG. 4.

The first state 40, as shown in FIG. 5, is formed as a combination circuit of a multiplier 51 for multiplying two input signals, a subtractor 52 for subtracting between two input signals, a first adder & subtractor 53 and a second adder & subtractor 54 for each adding and subtracting among four input signals, and a multiplexer (MUX) 55 for outputting a signal according to the input value of a select input port. Here, the output of the multiplier 51 is obtained through a shift and add operation, without an extra multiplier.

Figure 6:
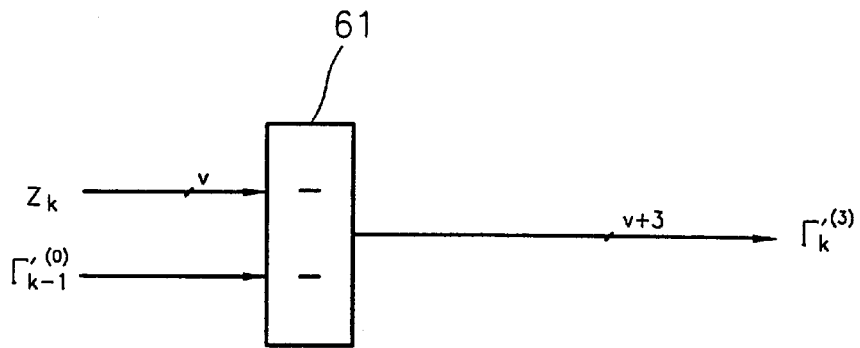
FIG. 6 shows an operational algorithm in the second state $s_3$ of the BMC/ACS unit shown in FIG. 4.
Figure 7:
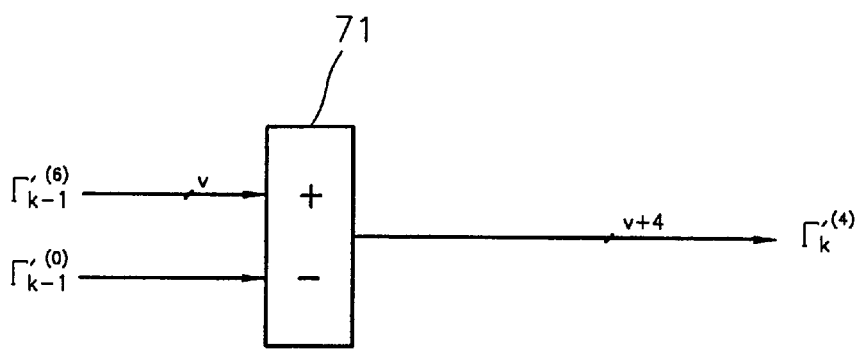
FIG. 7 shows an operational algorithm in the third state $s_4$ of the BMC/ACS shown in FIG. 4.
Figure 8:
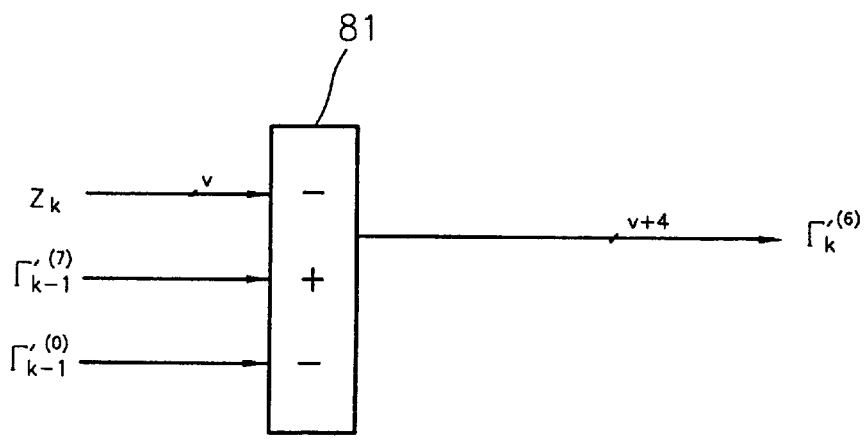
FIG. 8 shows an operational algorithm in the fourth state $s_6$ of the BMC/ACS shown in FIG. 4.

The second state 41 is comprised of a subtractor 61 for subtracting between two input signals, as shown in FIG. 6, the third state 42 is comprised of a subtractor 71 for subtracting between two input signals, as shown in FIG. 7, and the fourth state 43 is comprised of an adder & subtractor 81 for adding and subtracting among three input signals, as shown in FIG. 8.

Figure 9:
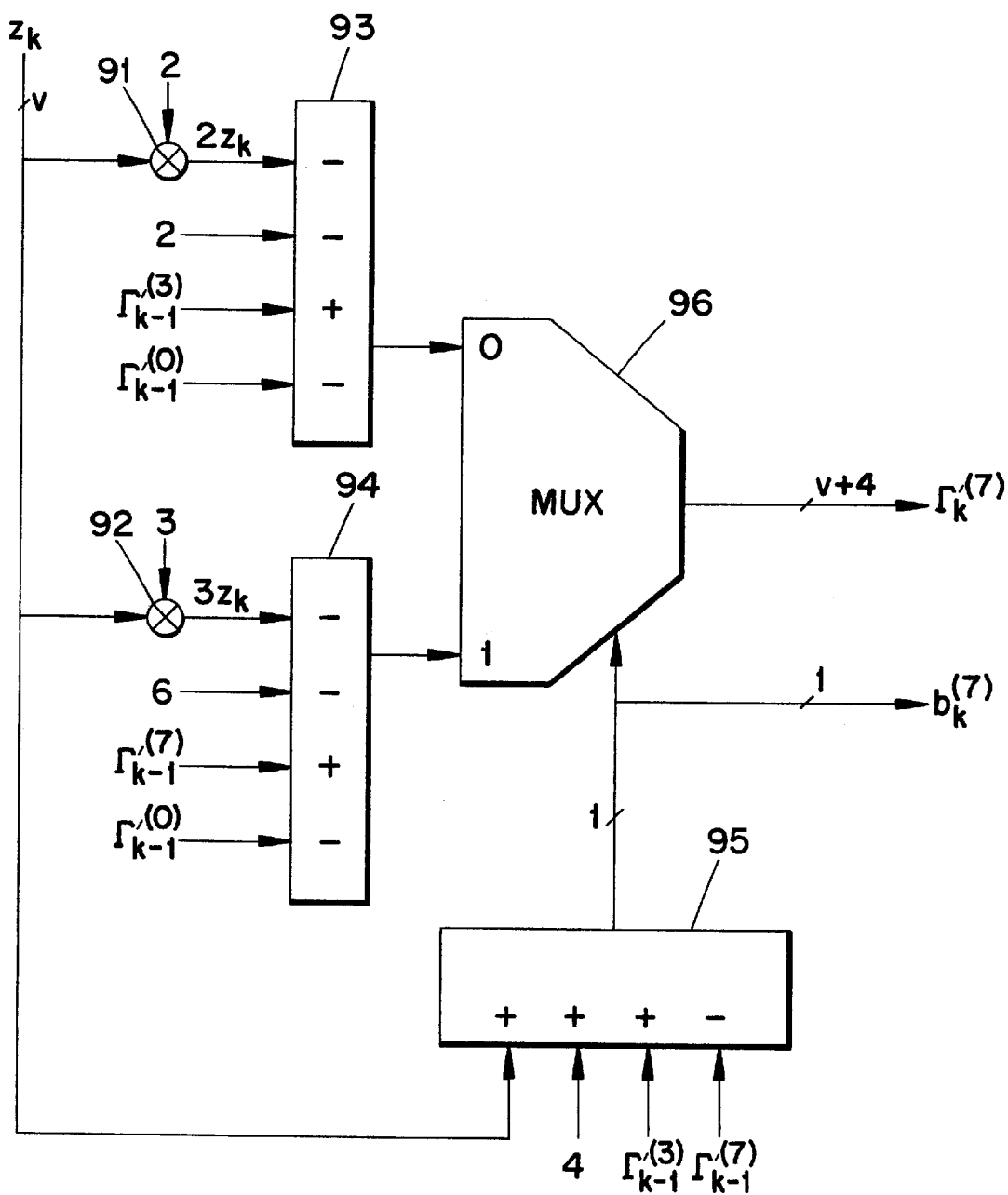
FIG. 9 shows an operational algorithm in the fifth state $s_7$ of the BMC/ACS shown in FIG. 4.

As shown in FIG. 9, the fifth state 44 is formed as a combination circuit of first and second multipliers 91 and 92 for each multiplying two input signals, first, second and third adder & subtractors 93, 94 and 95, for each adding and subtracting among four input signals, and a multiplexer (MUX) 96 for outputting a signal according to the input value of a select input port. Here, the outputs of the first and second multipliers 91 and 92 are obtained through a shift and add operation, without an extra multiplier, as in the case of the first state 40.

Figure 10:
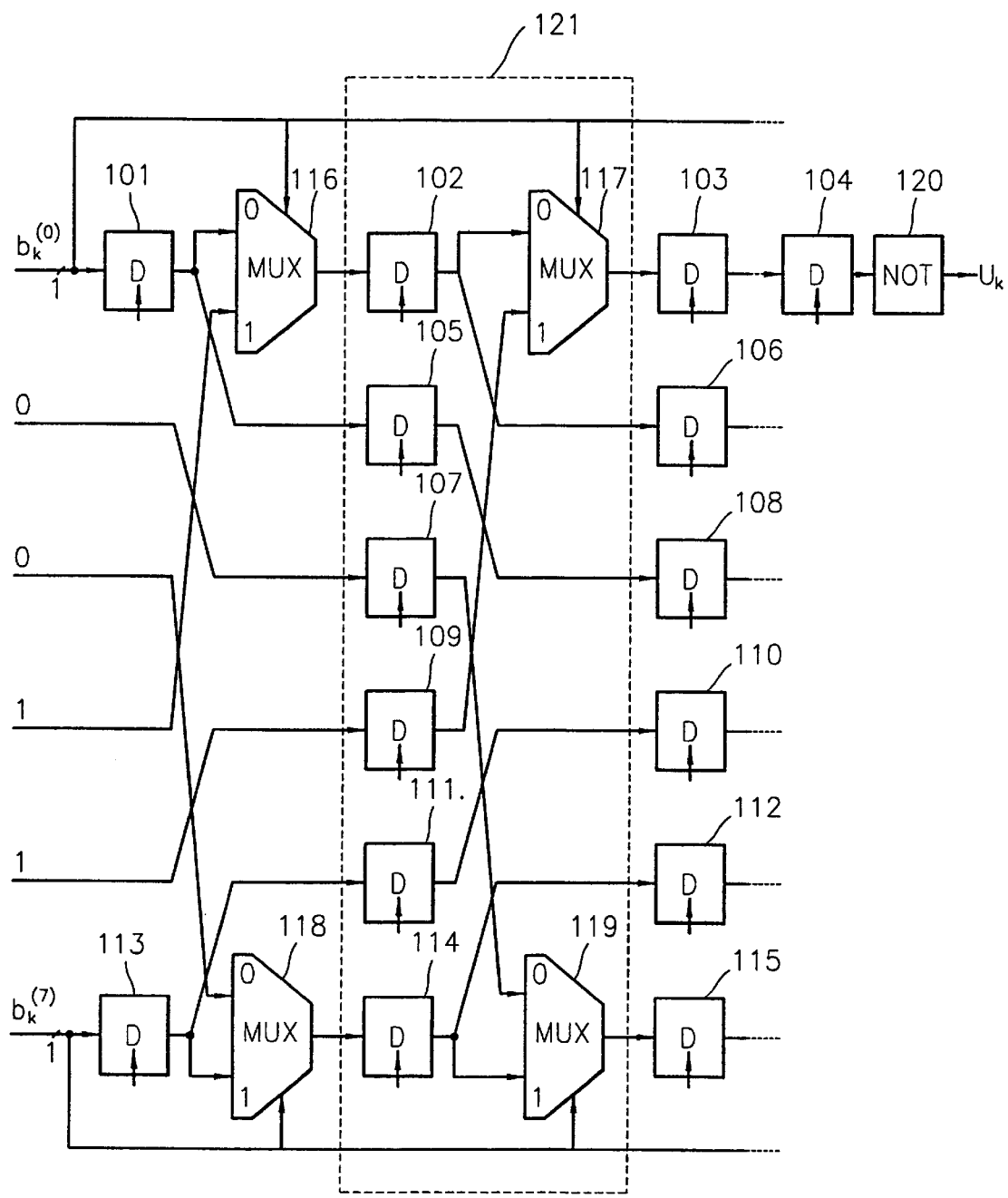
FIG. 10 is a diagram showing the structure of an internal system of a path memory of the Viterbi detector shown in FIG. 3.

Also, as shown in FIG. 10, the path memory 13b is formed as a shift register which is a combination circuit of a plurality of delay devices 101 through 115 for storing and outputting a survival path, first, second, third and fourth multiplexers 116 through 119, and a NOT gate 120. Here, the NOT gate 120 inverts an arbitrary bit of the final output passed through the delays 101 through 115, and outputs the inverted bit as detection data of the Viterbi detector 13. A block 121 enclosed by a dashed line may be duplicated as many times as required.

Operation of the signal detecting device of a data recording/reproducing apparatus and a signal detection method according to the present invention will now be described.

Referring to FIG. 1, after reproduction by a data recording/reproducing apparatus (not shown), an analog signal a(t) from which an external band noise has been removed is converted into a digital signal $a_k$ while passing through the ADC 11. The digital signal $a_k$ is delayed by the delay device 14 for a predetermined time in order to match a clock for processing the digital signal. Then, the delayed digital signal is modified into a spectrum $z_k$ ($=2+D+D^2+D^3$) suitable for the Viterbi detector 13 while passing through the FIR filter 12. Then, the modified signal $z_k$ is detected by the Viterbi detector 13 as a data $U_k$ which has been recorded in the data recording/reproducing apparatus.

Here, an algorithm used by the Viterbi detector 13 to detect the modified signal $z_k$ as the data $U_k$ will be described in detail.

A maximum likelihood sequence detector (MLSD) of the Viterbi detector 13 detects data $a_0, a_1, \ldots, a_k$ which minimize the Euclidean distance (Ed) expressed by the following equation (1), from the received signals $z_0, z_1, \ldots, z_k$.

$$Ed = \sum_{i=0}^{k} (z_i - d_i)^2 \quad (1)$$

In the equation (1), $d_k = 2a_k + a_{k-1} + a_{k-2} + a_{k-3}$ and $z_i$ is a given value, so that the minimization process can be converted into the following maximization process expressed by the equation (2).

$$\text{minimize} \sum_{i=0}^{k} (z_i - d_i)^2 = \text{minimize} \sum_{i=0}^{k} z_i^2 - 2\sum_{i=0}^{k} (z_i d_i - d_i^2/2) \quad (2)$$

$$= \text{maximize} \sum_{i=0}^{k} (z_i d_i - d_i^2/2)$$

Figure 2:
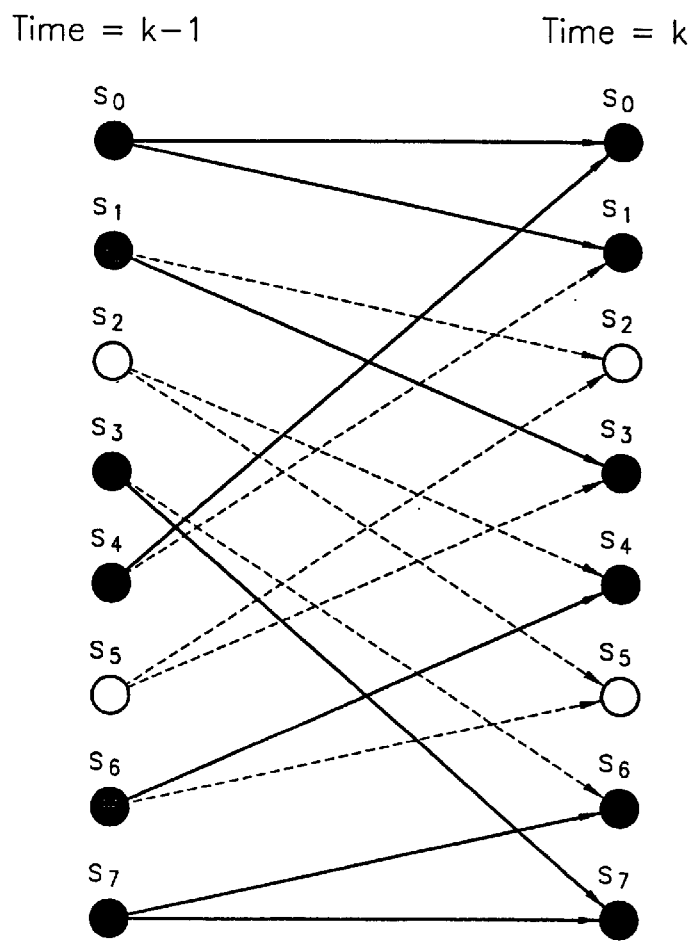
FIG. 2 is a Viterbi trellis diagram used for realizing a Viterbi detector of the signal detecting device shown in FIG. 1.

Here, the Viterbi detector 13 realizes the MLSD using a trellis by a dynamic programming method. For example, FIG. 2 shows the trellis of a [2111] Viterbi detector in consideration of the EFM code having d=2. With regard to the trellis diagram of FIG. 2, a branch metric $\lambda_k$ computed when each state is shifted to another state is induced by the following equation (3). The results are shown in Table 1.

$$\lambda_k = d_k z_k - d_k^2/2 \quad (3)$$

TABLE 1

| $s_{k-1} \rightarrow s_k$ | $d_k$ | $\lambda_k(s_{k-1} \rightarrow s_k)$ |
|---|---|---|
| $0 \rightarrow 0$ | 5 | $5z_k - 12.5$ |
| $0 \rightarrow 1$ | 1 | $z_k - 0.5$ |

TABLE 1-continued

| $s_{k-1} \to s_k$ | $d_k$ | $\lambda_k(s_{k-1} \to s_k)$ |
|---|---|---|
| 1 → 3 | −1 | $-z_k - 0.5$ |
| 3 → 7 | −3 | $-3z_k - 4.5$ |
| 4 → 0 | 3 | $3z_k - 4.5$ |
| 6 → 4 | 1 | $z_k - 0.5$ |
| 7 → 6 | −1 | $-z_k - 0.5$ |
| 7 → 7 | −5 | $-5z_k - 0.5$ |

Also, the state metric for each $s_k$ (=0, ..., 7) is updated using the above branch metric by the following equation (4).

$$\Gamma_k(s_k) = \max_{s_{k-1}}\{\lambda_k(s_{k-1} \to s_k) + \Gamma_{k-1}(s_k)\} \quad (4)$$

Hereinafter, updating of the state metric in each state will be described in detail.

$$\text{state 0: } \Gamma_k^{(0)} = \max\{\lambda_k(0 \to 0) + \Gamma_{k-1}^{(0)}, \lambda_k(4 \to 0) + \Gamma_{k-1}^{(4)}\}$$

$$\therefore \Gamma_k^{(0)} = \max\{5z_k - 12.5 + \Gamma_{k-1}^{(0)}, 3z_k - 4.5 + \Gamma_{k-1}^{(4)}\}$$

$$\text{state 1: } \Gamma_k^{(1)} = \lambda_k(0 \to 1) + \Gamma_{k-1}^{(0)}$$

$$\therefore \Gamma_k^{(1)} = z_k - 0.5 + \Gamma_{k-1}^{(0)}$$

$$\text{state 3: } \Gamma_k^{(3)} = \lambda_k(1 \to 3) + \Gamma_{k-1}^{(1)}$$

$$\therefore \Gamma_k^{(3)} = -z_k - 0.5 + \Gamma_{k-1}^{(1)}$$

$$\text{state 4: } \Gamma_k^{(4)} = \lambda_k(6 \to 4) + \Gamma_{k-1}^{(6)}$$

$$\therefore \Gamma_k^{(4)} = z_k - 0.5 + \Gamma_{k-1}^{(6)}$$

$$\text{state 6: } \Gamma_k^{(6)} = \lambda_k(7 \to 6) + \Gamma_{k-1}^{(7)}$$

$$\therefore \Gamma_k^{(3)} = -z_k - 0.5 + \Gamma_{k-1}^{(7)}$$

$$\text{state 7: } \Gamma_k^{(7)} = \max\{\lambda_k(3 \to 7) + \Gamma_{k-1}^{(3)}, \lambda_k(7 \to 7) + \Gamma_{k-1}^{(7)}\}$$

$$\therefore \Gamma_k^{(7)} = \max\{-3z_k - 4.5 + \Gamma_{k-1}^{(3)}, -5z_k - 12.5 + \Gamma_{k-1}^{(7)}\}$$

However, the above method of maximizing the metric value frequently causes overflow. Thus, in order to prevent such overflow, $\Gamma_k^{(1)}$ is subtracted from each state metric, and the result is divided by 2, for convenience of computation. This computation is summarized as follows.

$$\text{state 0: } \Gamma_k'^{(0)} = (\Gamma_k^{(0)} - \Gamma_k^{(1)})/2$$

$$= \max\{2z_k - 6, z_k - 2 + \Gamma_{k-1}'^{(4)} - \Gamma_{k-1}'^{(0)}\}$$

$$\text{state 1: } \Gamma_k'^{(1)} = (\Gamma_k^{(1)} - \Gamma_k^{(1)})/2 = 0$$

$$\text{state 3: } \Gamma_k'^{(3)} = (\Gamma_k^{(3)} - \Gamma_k^{(1)})/2 = -z_k - \Gamma_{k-1}'^{(0)}$$

$$\text{state 4: } \Gamma_k'^{(4)} = (\Gamma_k^{(4)} - \Gamma_k^{(1)})/2 = \Gamma_{k-1}'^{(6)} - \Gamma_{k-1}'^{(0)}$$

$$\text{state 6: } \Gamma_k'^{(6)} = (\Gamma_k^{(6)} - \Gamma_k^{(1)})/2 = -z_k + \Gamma_{k-1}'^{(7)} - \Gamma_{k-1}'^{(0)}$$

$$\text{state 7: } \Gamma_k'^{(7)} = (\Gamma_k^{(7)} - \Gamma_k^{(1)})/2$$

$$= \max\{-2z_k - 2 + \Gamma_{k-1}'^{(3)} - \Gamma_{k-1}'^{(0)}, -3z_k - 6 + \Gamma_{k-1}'^{(7)} - \Gamma_{k-1}'^{(0)}\}$$

Also, the maximum and minimum values of the state metrics are obtained as shown in Table 2, through simulation. Thus, the number of bits required for each state metric, to prevent overflow in the Viterbi detector 13, is summarized in Table 2. Here, it is assumed that the input of the Viterbi input is 6 bits. If the input of the Viterbi detector 13 is v bits, the required number of bits is v+3 or v+4.

TABLE 2

| SMC | maximum | minimum | required number of bits | required number of bits |
|---|---|---|---|---|
| $\Gamma_{k-1}'^{(0)}$ | 35 | −19.5 | 6 + 1 + 2 = 9 | v + 3 |
| $\Gamma_{k-1}'^{(3)}$ | 26.75 | −36.25 | 6 + 1 + 2 = 9 | v + 3 |
| $\Gamma_{k-1}'^{(4)}$ | 57.5 | −76.75 | 7 + 1 + 2 = 10 | v + 4 |
| $\Gamma_{k-1}'^{(6)}$ | 70.25 | −70.25 | 7 + 1 + 2 = 10 | v + 4 |
| $\Gamma_{k-1}'^{(7)}$ | 75.75 | −57 | 7 + 1 + 2 = 10 | v + 4 |

Based on the above algorithm, the BMC/ACS unit 13a receives $z_k$ and outputs $b_k^{(0)}$ and $b_k^{(7)}$. The path memory 13b receives the output $b_k^{(0)}$ and $b_k^{(7)}$, and outputs $U_k$. Here, a signal input/output relationship within the BMC/ACS unit 13a in each state, and the operation thereof, will be described with reference to FIG. 4.

As shown in FIG. 4, the first state 40 receives $\Gamma_{k-1}'^{(4)}$ of (v+4) bits, $z_k$ of v bits and $\Gamma_{k-1}'^{(0)}$ of (v+3) bits, and outputs $\Gamma_k'^{(0)}$ of (v+3) bits and $b_k^{(0)}$ of 1 bit. Also, the second state 41 receives $z_k$ of v bits and $\Gamma_{k-1}'^{(0)}$ of (v+3) bits, and outputs $\Gamma_k'^{(3)}$ of (v+3) bits, and the third state 42 receives $\Gamma_{k-1}'^{(0)}$ of (v+3) bits and $\Gamma_{k-1}'^{(6)}$ of (v+4) bits, and outputs $\Gamma_k'^{(4)}$ of (v+4) bits. The fourth state 43 receives $\Gamma_{k-1}'^{(0)}$ of (v+3) bits, $z_k$ of v bits and $\Gamma_{k-1}'^{(7)}$ of (v+4) bits, and outputs $\Gamma_k'^{(6)}$ of (v+4) bits, and the fifth state 44 receives $\Gamma_{k-1}'^{(3)}$ of (v+3) bits, $z_k$ of v bits, $\Gamma_{k-1}'^{(0)}$ of (v+3) bits and $\Gamma_{k-1}'^{(7)}$ of (v+4) bits, and outputs $\Gamma_k'^{(7)}$ of (v+4) bits and $b_k^{(7)}$ of 1 bit. Here, each of the delay devices 45 through 49 receives $\Gamma_k'^{(s)}$ and outputs $\Gamma_{k-1}'^{(s)}$ by delaying for 1 cycle.

Here, computation in the state 40 is as follows. As shown in FIG. 5, the multiplier 51 receives $z_k$ of v bits and a constant of 2 and multiplies the inputs to output $2z_k$. Then, the subtractor 52 receives $2z_k$ and a constant of 6, and performs subtraction between the inputs to output the result of $2z_k-6$ to a 0 input port of the multiplexer MUX 55. The first adder & subtractor 53 receives $z_k$ of v bits, $\Gamma_{k-1}'^{(4)}$, $\Gamma_{k-1}'^{(0)}$ and a constant of 2, and adds and subtracts the inputs to output the result of $z_k-2+\Gamma_{k-1}'^{(4)}-\Gamma_{k-1}'^{(0)}$ to a 1 input port of the MUX 55. The second adder & subtractor 54 receives $z_k$ of v bits, a constant of 4, $\Gamma_{k-1}'^{(0)}$ and $\Gamma_{k-1}'^{(4)}$, and adds and subtracts the inputs to output only bits corresponding to the sign of the result of $z_k-4-\Gamma_{k-1}'^{(4)}+\Gamma_{k-1}'^{(0)}$ to a select input port of the MUX 55, and also as $b_k^{(0)}$ of 1 bit. Then, the MUX 55 outputs the input of the 0 input port as $\Gamma_k'^{(0)}$ of (v+3) bits if the input value of the select input port is 0, and the input of the 1 input port as $\Gamma_k'^{(0)}$ of (v+3) bits if the input value of the select input port is 1. Here, the multiplier 51 processes the signal through shifting and adding, without an extra multiplier.

FIGS. 6, 7, 8 and 9 illustrate computation in the second, third, fourth and fifth states, respectively, and such computation will now be described in sequence.

As shown in FIG. 6, the subtractor 61 receives $z_k$ of v bits and $\Gamma_{k-1}'^{(0)}$, performs subtraction between the inputs and outputs the result of $-z_k-\Gamma_{k-1}'^{(0)}$ as $\Gamma_k'^{(3)}$ of (v+3) bits. As shown in FIG. 7, the subtractor 71 receives $\Gamma_{k-1}'^{(6)}$ and $\Gamma_{k-1}'^{(0)}$, performs subtraction between the inputs, and outputs the result of $\Gamma_{k-1}'^{(6)}-\Gamma_{k-1}'^{(0)}$ as $\Gamma_k'^{(4)}$ of (v+4) bits. The adder & subtractor 81, as shown in FIG. 8, receives $z_k$ of v bits, $\Gamma_{k-1}'^{(7)}$ and $\Gamma_{k-1}'^{(0)}$, adds and subtracts the inputs, and outputs the result of $-z_k+\Gamma_{k-1}'^{(7)}-\Gamma_k'^{(0)}$ as $\Gamma_k'^{(6)}$ of (v+4) bits.

As shown in FIG. 9, the first multiplier 91 receives $z_k$ of v bits and a constant of 2, multiplies the inputs and outputs the result of $2z_k$. Then, the first adder & subtractor 93 receives the result of $2z_k$, a constant of 2, $\Gamma_{k-1}'^{(3)}$ and $\Gamma_{k-1}'^{(0)}$, adds and subtracts the inputs, and outputs the result of $-2z_k-2+\Gamma_{k-1}'^{(3)}-\Gamma_{k-1}'^{(0)}$ to a 0 input port of the MUX 96.

Also, the second multiplier 92 receives $z_k$ of v bits and a constant of 3, multiplies the inputs, and outputs the result of $3z_k$. Then, the second adder & subtractor 94 receives $3z_k$, a constant of 6, $\Gamma'_{k-1}{}^{(7)}$ and $\Gamma'_{k-1}{}^{(0)}$, adds and subtracts the inputs, and outputs the result of $-3z_k-6+\Gamma'_{k-1}{}^{(7)}-\Gamma'_{k-1}{}^{(0)}$ to a 1 input port of the MUX 96. The third adder & subtractor 95 receives $z_k$ of v bits, a constant of 4, $\Gamma'_{k-1}{}^{(3)}$ and $\Gamma'_{k-1}{}^{(7)}$, adds and subtracts the inputs, and outputs only bits corresponding to the sign of the result of $z_k+4+\Gamma'_{k-1}{}^{(3)}-\Gamma'_{k-1}{}^{(7)}$ to a select input port of the MUX 96, and also as $b_k{}^{(7)}$ of 1 bit. Then, the MUX 96 outputs the input of the 0 input port as $\Gamma'_k{}^{(7)}$ of (v+4) bits if the input value of the select input port is 0, and outputs the input of the 1 input port as $\Gamma'_k{}^{(7)}$ of (v+4) bits if the input value of the select input port is 1. Here, the first and second multipliers 91 and 92 perform shifting and adding, without an extra multiplier, as in the case of the multiplier 51 shown in FIG. 5.

After the BMC/ACS unit 13*a* outputs its signal processing result obtained through above series of steps, the path memory 13*b* receives the output to perform a final signal processing which will be described below with reference to FIG. 10.

Referring to FIG. 10, the delay device 101 receives $b_k{}^{(0)}$ of 1 bit, delays the input for one cycle, and outputs the delayed result to a 0 input port of the MUX 116 and to the delay device 105. The MUX 116 receives $b_k{}^{(0)}$ at its select input port, and outputs the input of the 0 input port if $b_k{}^{(0)}$ is 0, and the input of a 1 input port if $b_k{}^{(0)}$ is 1, to the delay device 102. A constant of 0 is input to the delay device 107 and a 0 input port of the MUX 118, and a constant of 1 is input to a 1 input port of the MUX 116 and the delay device 109. The delay device 113 receives $b_k{}^{(7)}$ of 1 bit, delays the input for one cycle, and outputs the delayed result to a 1 input port of the MUX 118 and to the delay device 111. The MUX 118 receives $b_k{}^{(7)}$ at its select input port, and outputs the input of a 0 input port if $b_k{}^{(7)}$ is 0, and the input of a 1 input port if $b_k{}^{(7)}$ is 1, to the delay device 114.

The delay device 102 delays its input by one cycle, and outputs the delayed result to a 0 input port of the MUX 117 and the delay device 106. The MUX 117 receives $b_k{}^{(0)}$ at its select input port, and outputs the input of a 0 input port if $b_k{}^{(0)}$ is 0, and the input of a 1 input port if $b_k{}^{(0)}$ is 1, to the delay device 103. The delay device 105 delays its input by one cycle, and outputs the delayed result to the delay device 108. The delay device 107 delays its input by one cycle, and outputs the delayed result to a 0 input port of the MUX 119. The delay device 109 delays its input by one cycle, and outputs the delayed result to a 1 input port of the MUX 117. The delay device 111 delays its input by one cycle, and outputs the delayed result to the delay device 110. The delay device 114 delays its input by one cycle, and outputs the delayed result to the delay device 112 and a 1 input port of the MUX 119. The MUX 119 receives $b_k{}^{(7)}$ at its select input port, and outputs the input of a 0 input port if $b_k{}^{(7)}$ is 0, and the input of a 1 input port if the input value is 1, to the delay device 115. Here, a combined circuit within the block 121, comprising the delays 102, 105, 107, 109, 111 and 114 and the MUXs 117 and 119, may be duplicated as many times as required.

After passing through a number of the blocks 121, the delay device 104 delays its input by one cycle and outputs the delayed result to the NOT gate 120. Then, the NOT gate 120 inverts its input to output the final signal $U_k$.

Figure 11:
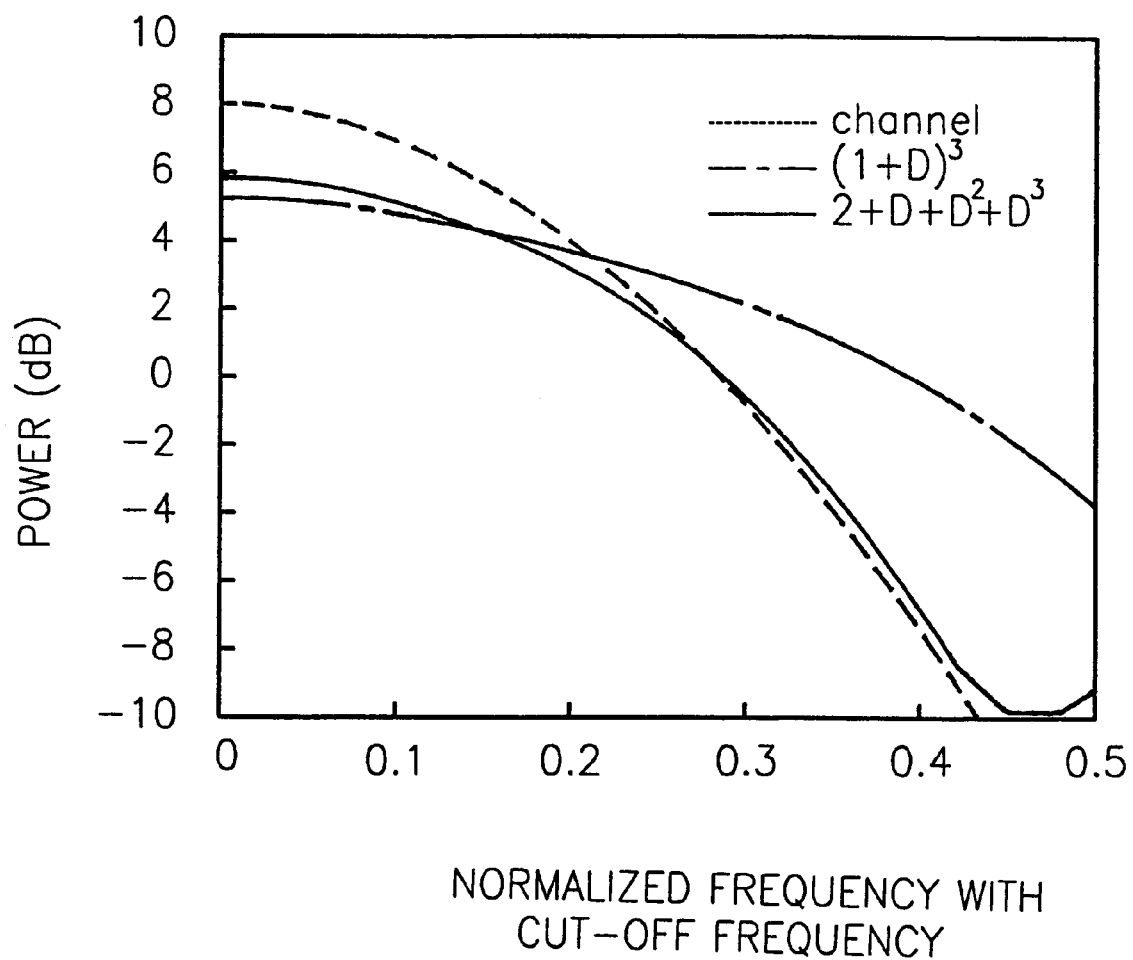
FIG. 11 is a graph showing spectrum response characteristics of a channel, $(1+D)^3$ and $2+D+D^2+D^3$ employed in the signal detection method of the data recording/reproducing apparatus according to the present invention.

FIG. 11 is a graph showing spectrum response characteristics of a channel, $(1+D)^3$ and $2+D+D^2+D^3$ employed in the signal detection method of a data recording/reproducing apparatus according to the present invention.

As shown in FIG. 11, a target spectrum (solid line) of the equalizer is more similar to the spectrum of the channel (dashed line) than the conventional spectrum (dotted and dashed line). Thus, noise by the equalizer hardly increases, and loss caused by the ISI is overcome by the maximum likelihood (ML) detection, thereby detecting the signal with reliability.

As described above, in the signal detection device and method in a data recording/reproducing apparatus according to the present invention, a PRML system suitable for the channel of the optical recording/reproducing apparatus is used, so the signal is equalized into the spectrum expressed by $2+D+D^2+D^3$, which is similar to that of the optical recording/reproducing apparatus, and the ML is detected by the Viterbi detector. Accordingly, noise scarcely increases and loss by the ISI is overcome, so that the signal can be detected with reliability.

What is claimed is:

1. A signal detection method of a data recording/reproducing apparatus for recording/reproducing a digital signal $U_k$ having an arbitrary integer time k as an index, the method comprising the steps of:

(a) converting an analog signal from which external band noise is removed after being reproduced from the data recording/reproducing apparatus, into a digital signal;

(b) modifying the digital signal into a signal having a predetermined spectral characteristic; and (c) detecting the modified spectrum signal which is expressed by a polynomial equation of $2+D+D^2+D^3$, where D represents a delay, as the data recorded in the data recording/reproducing apparatus.

2. The signal detection method of claim 1, wherein the step (c) is performed by a maximum likelihood sequence detection (MLSD) method.

3. The signal detection method of claim 2, wherein in the maximum likelihood sequence detection (MLSD) method, a channel transmits or records a binary symbol having the digital signal value of +1 or −1, a block signal is filtered and sampled to obtain a sample signal $Z_k$ having interference expressed by the polynomial equation of $2+D+D^2+D^3$, and a binary symbol which has the highest probability of being transmitted or recorded is determined.

4. The signal detection method of claim 3, wherein the determination of the binary symbol is performed such that a binary survival sequence of the state is updated.

5. A signal detection device of a data recording/reproducing apparatus for recording/reproducing a digital signal $U_k$ having an arbitrary integer time k as an index, comprising:

an analog-to-digital converter (ADC) for converting an analog signal from which external band noise is removed after being reproduced from the data recording/reproducing apparatus, into a digital signal;

a filter for modifying the digital signal converted by the analog-to-digital converter (ADC) into a signal having a predetermined spectral shape expressed by $2+D+D^2+D^3$ where D represents a delay; and a Viterbi detector for detecting the spectrum signal modified by the filter as the data recorded in the data recording/reproducing apparatus.

6. The signal detection device of claim 5, further comprising a delay device between the ADC and the filter, for enhancing the detection capability of the Viterbi detector according to the predetermined spectral shape by matching a clock signal for processing the digital signal.

7. The signal detection device of claim 5, wherein the Viterbi detector comprises:

a branch metric computation/add compare select (BMC/ACS) unit for computing and updating state metrics; and a path memory for determining a final output of the Viterbi detector based on the data computed and updated by the branch metric computation/add compare select (BMC/ACS) unit.

8. The signal detection device of claim 7, wherein the branch metric computation/add compare select (BMC/ACS) unit is a combination circuit comprising five states $s_0$, $s_3$, $s_4$, $s_6$ and $s_7$ for simultaneously generating and outputting a decisive bit, and five delay devices for respectively receiving the output signals of the five states, delaying the output signals for a predetermined time, and outputting the delayed signals.

9. The signal detection device of claim 8, wherein the slate $s_0$ is a combination circuit comprising:

a multiplier for receiving and multiplying two input signals;

a subtractor for subtracting between input signals;

two adder & subtractors for adding and subtracting input signals, wherein the subtractor receives two signals, and the other two adder & subtractors each receive four input signals; and a multiplexer for outputting an input signal according to a value input to a select input port.

10. The signal detection device of claim 8, wherein the state $s_3$ comprises a subtractor for receiving two signals and subtracting between the two input signals.

11. The signal detection device of claim 8, wherein the state $s_4$ comprises a subtractor for receiving two signals, and subtracting between the two signals.

12. The signal detection device of claim 8, wherein the state $s_6$ comprises an adder & subtractor for receiving three signals, and adding and subtracting the three input signals.

13. The signal detection device of claim 8, wherein the states $s_7$ is a combination circuit comprising:

two multipliers each for receiving and multiplying two signals;

three adder & subtractors each for receiving four signals, and adding and subtracting the four input signals; and a multiplexer for outputting an input signal according to a value input to a select input port.

14. The signal detection device of claim 9, wherein the outputs of the multipliers are obtained through shifting and adding, without extra multipliers.

15. The signal detection device of claim 13, wherein the outputs of the multipliers are obtained through shifting and adding, without extra multipliers.

16. The signal detection device of claim 7, wherein the path memory is formed as a shift register for storing a survival path and outputting the stored path.

* * * * *